(12) United States Patent
Wei et al.

(10) Patent No.: US 8,828,866 B1
(45) Date of Patent: Sep. 9, 2014

(54) METHODS FOR DEPOSITING A TANTALUM SILICON NITRIDE FILM

(71) Applicants: Guodan Wei, San Jose, CA (US); Paul F. Ma, Santa Clara, CA (US)

(72) Inventors: Guodan Wei, San Jose, CA (US); Paul F. Ma, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/927,460

(22) Filed: Jun. 26, 2013

(51) Int. Cl.
*H01L 21/4763* (2006.01)
*H01L 21/44* (2006.01)
*H01L 21/285* (2006.01)
*H01L 21/768* (2006.01)

(52) U.S. Cl.
CPC .... *H01L 21/28568* (2013.01); *H01L 21/76856* (2013.01); *H01L 21/76846* (2013.01); *H01L 21/76843* (2013.01)
USPC ..... 438/653; 438/643; 438/627; 257/E21.584

(58) Field of Classification Search
CPC .................. H01L 21/76846; H01L 21/76843; H01L 21/76856; H01L 21/76883; H01L 21/76841; H01L 21/28556
USPC ........... 438/653, 643, 627, 677; 257/E21.584
See application file for complete search history.

(56) References Cited

U.S. PATENT DOCUMENTS

| | | | | |
|---|---|---|---|---|
| 7,122,474 B2 * | 10/2006 | Lee | ................................ | 438/683 |
| 7,833,906 B2 * | 11/2010 | Knapp et al. | .................. | 438/680 |
| 7,943,501 B2 * | 5/2011 | Vaartstra | ........................ | 438/592 |
| 7,998,842 B2 * | 8/2011 | Cabral et al. | .................. | 438/485 |
| 8,243,506 B2 * | 8/2012 | Liu | ................................ | 365/163 |

OTHER PUBLICATIONS

Lee, Eung-Min et al., "Diffusion Barrier Characteristics of TaSiN for Pt/TaSiN/Poly-Si Electrode Structure of Semiconductor Memory Device", *Journal of The Electrochemical Society*, 148 (11) 2001, G611-G615.
Padiyar, Sumant, "A Dissertation", *University at Albany, State University of New York* 2003, 24 pgs.
Zhang, Xiao-Meng et al., "Ru/TaSiN with Different Ta/Si Atomic Ratio as Barrier for Cu Contact on NiSi Substrate", *Dept. of Microelectronics, Fudan University*, 3 pgs, 2010.

* cited by examiner

*Primary Examiner* — Michael Trinh
(74) *Attorney, Agent, or Firm* — Servilla Whitney LLC

(57) ABSTRACT

Provided are methods of forming a ternary metal nitride film and more specifically, a TaSiN film. A metal nitride film, or TaN film, is deposited on a substrate with plasma treatment. A SiN layer is deposited on the metal nitride, or TaN, film to form a metal-SiN, or TaSiN, film. The film is then annealed to provide a metal nitride film with stable resistivity.

20 Claims, 1 Drawing Sheet

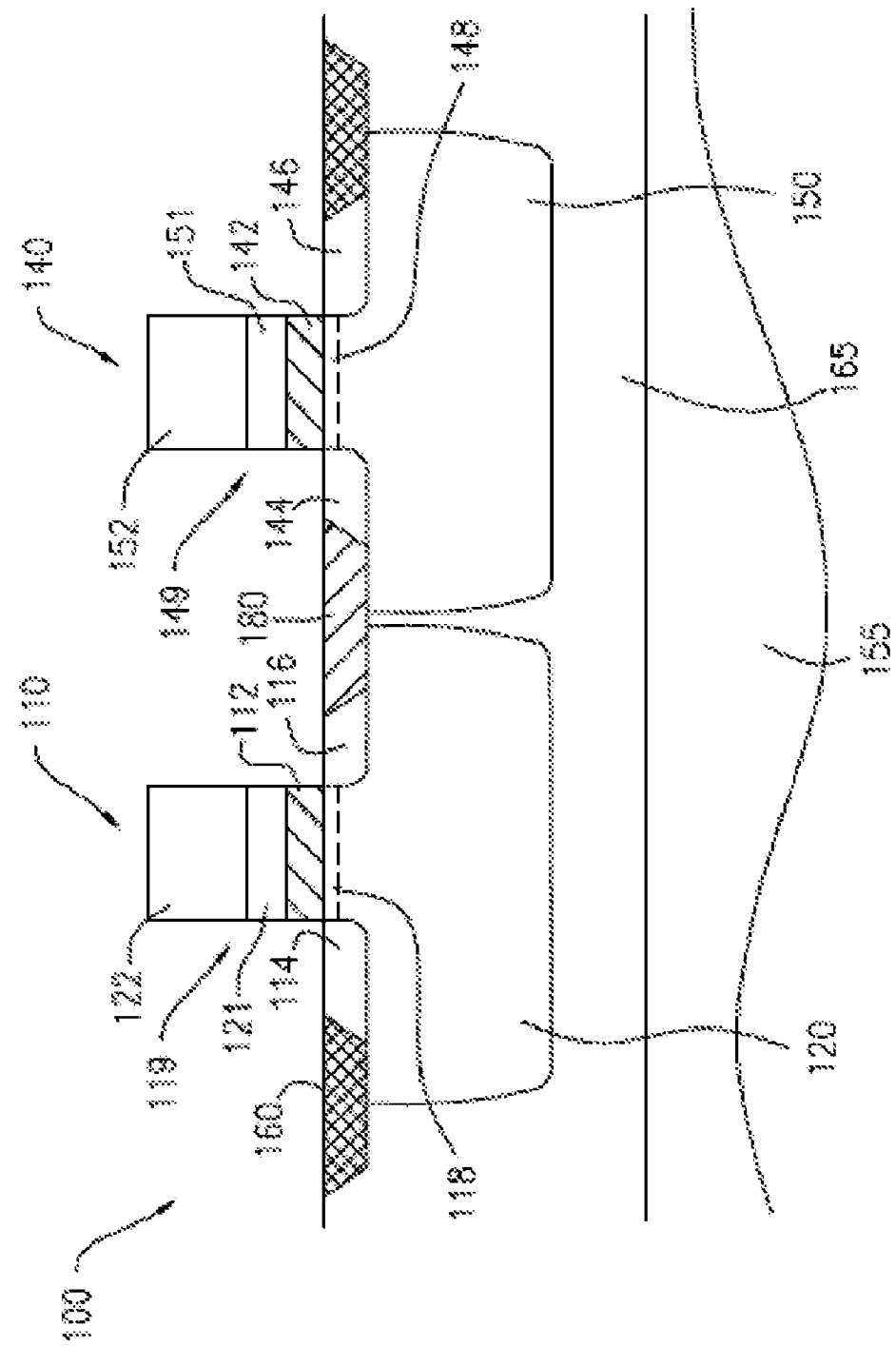

METHODS FOR DEPOSITING A TANTALUM SILICON NITRIDE FILM

Embodiments of the invention generally relate to high-k dielectric and/or metal gate technology. More specifically, embodiments of the invention are directed to methods of depositing metal gate electrodes.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Advances in fabrication of down-scaled microelectronic devices have enabled millions of electronic circuit devices to be formed in a single chip. The continuous down-scaling of microelectronic devices over the last 30 or so years has been accomplished by shrinking the feature sizes as nodes below 22 nm. To carry on this shrinkage further, new materials and new fabrication techniques must be explored.

Traditionally, thermal atomic layer deposition (thermal ALD) TaN has been effectively explored as a barrier material in metal gates for the next generation of ultra-large scale integration microelectronics. The gate material should have an appropriate work function, high thermal stability, low reactivity and low electrical resistivity. This is especially true for the barrier applications in dynamic random access memory (DRAM) devices, in which the as-deposited TaN should have stable resistivity after exposure to an annealing process at a temperature as high as 750° C. The drift of the resistivity should be controlled to a tolerance of less than about 15%. Use of the traditional thermal ALD TaN is limited due to the inability of the thermal TaN layer to satisfy this requirement.

A promising candidate for meeting the resistivity requirements is a ternary metal nitride, such as TaSiN, owing to the tenability of the effective work function and thermal stability. There is an ongoing need in the art for methods of accurately, reproducibly and cost-effectively depositing a ternary metal nitride film, or specifically a TaSiN film.

SUMMARY

One or more embodiments of the invention are directed to methods of forming a ternary metal nitride film. A metal nitride film is deposited on a substrate. The metal nitride film is exposed to a plasma to form a plasma treated metal nitride film. A SiN layer is deposited on the plasma treated metal nitride film to form a metal-SiN film. The metal-SiN film is annealed to decrease the film resistivity.

In some embodiments, the plasma comprises one or more of hydrogen, argon, nitrogen and ammonia. In one or more embodiments, the plasma comprises a mixture of argon and ammonia. In some embodiments, the plasma has a frequency of about 40 MHz.

In some embodiments, the metal of the metal nitride film comprises tantalum and the metal nitride film comprises TaN. In one or more embodiments, the metal-SiN film comprises TaSiN and has a thickness about 50 Å. In some embodiments, depositing the TaN film comprises sequentially exposing the substrate to pentakis(dimethylamino)tantalum (PDMAT) and ammonia. In one or more embodiments, depositing the SiN layer comprises sequentially exposing the plasma treated TaN film to disilane and ammonia.

In some embodiments, the TaSiN film is annealed at a temperature in the range of about 600° C. to about 900° C. under a nitrogen atmosphere for a time in the range of about 30 second to about 90 seconds. In one or more embodiments, the TaSiN film has a silicon content in the range of about 5 atomic % to about 15 atomic %. In some embodiments, forming the plasma treated metal nitride film comprises repeatedly depositing in the range of about two layers to about 5 layers of TaN by ALD followed by treatment with an argon/ammonia plasma until a film having a thickness about 50 Å is formed. In one or more embodiments, the TaN film is plasma treated after deposition of no more than 10 Å TaN. In some embodiments, the post-anneal resistivity of the TaSiN film is less than about 25 ohm-cm. Some embodiments further comprise depositing a thermal TaN film having a thickness about 10 Å prior to the deposition of the metal nitride film.

Additional embodiments of the invention are directed to methods of forming a TaSiN film. At least a portion of a substrate surface is sequentially exposed to a tantalum-containing precursor and a reactive gas comprising ammonia to deposit a TaN film on the substrate surface. The TaN film is exposed to a plasma comprising ammonia and argon to form a plasma treated TaN film. The plasma treated TaN film is exposed to deposition gases comprising disilane and ammonia to deposit a SiN layer on the plasma treated TaN film to form a TaSiN film. The TaSiN film is annealed to decrease the film resistivity at a temperature greater than about 600° C. in an inert atmosphere.

In some embodiments, depositing the SiN layer comprises sequentially exposing the TaN film to a first deposition gas comprising disilane and a second deposition gas comprising ammonia. In one or more embodiments, the tantalum-containing precursor comprises pentakis(dimethylamino)tantalum (PDMAT). In some embodiments, the TaN film is exposed to the plasma after deposition of no more than about 10 Å TaN.

One or more embodiments further comprise depositing a thermal TaN film as a bottom layer prior to deposition of the TaN film by sequential exposure to the tantalum-containing precursor and the reactive gas comprising ammonia.

Further embodiments of the invention are directed to methods of forming a TaSiN film. A plasma treated TaN film is formed comprising (a) exposing a least a portion of a substrate surface to a tantalum-containing precursor and reactive gas comprising ammonia to deposit a TaN film on the substrate surface having a thickness no more than about 10 Å; (b) the TaN film is exposed to a plasma comprising ammonia and argon to form a plasma treated TaN film. Steps (a) and (b) are repeated to form the plasma treated TaN film of a predetermined thickness. The plasma treated TaN film is exposed to deposition gases comprising disilane and ammonia to deposit a SiN layer on the plasma treated TaN film to form a TaSiN film. The TaSiN film is annealed at a temperature greater than about 600° C. in an in an inert atmosphere to decrease film resistivity.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a cross-sectional view of a field effect transistor pair.

DETAILED DESCRIPTION

Embodiments of the invention are directed to methods for depositing a ternary metal nitride film. As used in this specification and the appended claims, the term "ternary metal nitride" refers to a film comprising three elements. For example, a ternary metal nitride can comprise a metal, nitrogen and a doping element (e.g., TaSiN). According to some embodiments, a TaSiN film has been successfully developed through co-flowing disilane and ammonia gases on a pre-plasma (Ar/$NH_3$) treated TaN thin film. The thickness of the metal nitride film can be precisely controlled through pump/purge cycles and time.

A "substrate" as used herein, refers to any substrate or material surface or film formed on a substrate upon which processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, dielectrics, high-k dielectrics and other conductive materials, depending on the application. Substrates include, without limitation, semiconductor wafers. Substrates may be exposed to a pretreatment process, for example, to polish, etch, reduce, oxidize, hydroxylate, anneal and/or bake the substrate surface. In addition to film processing directly on the surface of the substrate itself, any of the film processing steps disclosed may also be performed on an underlayer formed on the substrate as disclosed in more detail below, and the term "substrate surface" is intended to include such underlayer as the context indicates. The term "substrate surface" can refer to the entire substrate surface or a portion of the substrate surface.

Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Embodiments of the invention are useful in the manufacture of semiconductor devices, including but not limited to semiconductor devices that require a capacitive element. Examples of such devices include metal oxide semiconductor field effect transistors (MOSFET). MOS device design is a complicated process. For example, in the design of MOSFETs, improvements made by maximizing drive current result in increased leakage current. Conversely, an improvement such as decreased leakage current negatively impacts the drive current.

Embodiments of the invention can be used in many different applications, including logic-related (e.g., transistors) and non-logic related applications (e.g., memory devices). For convenience, descriptions of the various embodiments are made with reference to a logic-related application, but it will be understood that the scope of the invention extends beyond logic-related applications. One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon substrate 155 doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a high-k dielectric cap layer 121 and a metal gate work function layer 122. The source and drain regions are n-type regions on opposite sides of the gate region 119. Channel region 118 is interposed between source region 114 and drain region 116. A gate dielectric layer 112 separates channel region 118 and metal gate work function layer 121. Gate dielectric layer 112 electrically insulates first metal region 121 from channel region 118. The gate dielectric layer 112, the high-k dielectric cap layer 121 metal gate work function layer 122 together may be referred to herein as a gate stack. The gate dielectric region 112 can be any suitable high-k dielectric material. In some embodiments, the high-k dielectric cap layer 121 can have dual functionality and also serves as an effective Al barrier. Alternatively, high-k dielectric cap layer 121 may comprise two or more layers. When an appropriate voltage is applied between p-type silicon substrate 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a high-k dielectric cap layer 151 and a metal gate work function layer 152. The source and drain regions are p-type regions on opposite sides of gate region 149. Channel region 148 is interposed between source region 144 and drain region 146. A gate dielectric 142 separates channel region 148 and high-k dielectric cap layer 151. Dielectric 142 electrically insulates high-k dielectric cap layer 151 from channel region 148. The gate dielectric layer 142, high-k dielectric cap layer 151 and metal gate work function layer 152 together may be referred to herein as a gate stack. In some embodiments, the high-k dielectric cap layer 151 may have dual functionality and also serves as an effective Al barrier. In one or more embodiments, high-k dielectric cap layer 151 may comprise two or more layers. When an appropriate voltage is applied between p-type silicon substrate 155 and gate region 149, holes from p-well 150 move into region 148 directly below dielectric layer 142 thereby creating a p-type channel 148. A voltage applied between source 144 and drain 146 causes current to flow between source 144 and drain 146.

Accordingly, in a broad sense, embodiments of the invention is directed to methods of forming a ternary metal nitride film. For ease of description, a TaSiN film will often be referenced, but it will be understood by those skilled in the art that other ternary metal nitride films can be deposited as well. Examples of ternary metal nitride films include, but are not limited to, TaSiN, TiSiN, WSiN, AlSiN, transitional metal nitrides, transition metal doped nitrides, and combinations thereof.

A metal nitride film is deposited on a substrate, substrate surface, or portion of a substrate surface. The metal nitride film is exposed to a plasma to generate a plasma treated metal nitride film. A silicon nitride (SiN) layer is deposited on the plasma treated metal nitride film to form a metal-SiN film. The metal-SiN film is then annealed to further decrease resistivity.

In some embodiments, the metal of the metal nitride film comprises tantalum. Thus, the metal nitride film comprises TaN. Other metals can be substituted for or in addition to tantalum. These alternate metals include, but not limited to, titanium, hafnium and germanium. These alternate metal substitutions or additions would result in the deposition of, for example, a TiN, HfN and GeN film, respectively.

In embodiments incorporating tantalum, deposition of the metal nitride film comprises sequentially exposing the substrate to pentakis(dimethylamino)tantalum (PDMAT) and ammonia. Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and inorganic/halide compounds. Generally, any suitable tantalum or titanium precursor used during the conventional TaN process can be used. Thus, tantalum precursors can include, but are not limited to tantalum pentachloride ($TaCl_5$), tantalum pentafluoride ($TaF_5$), tantalum pentabromide ($TaBr_5$), pentakis(dimethylamino)tantalum (PDMAT), t-butylimidotris(ethylmethylamido)tantalum (TBTEMT) and t-butylimidotris(diethylamido)tantalum (TBTDET).

Exposure of the substrate to the metal precursor (e.g., PDMAT) can be separate from or at the same time as the exposure to the reactive gas (e.g., a reducing agent like ammonia). In some embodiments, exposure to the metal precursor at least partially overlaps with the exposure of the substrate to the reactive gas. As used in this specification and the appended claims, the term "at least partially overlaps" means that both the metal precursor and the reactant are flowed into the processing chamber to the substrate surface at the same time for at least some portion of the processing period. For example, in a traditional CVD process, both the metal precursor and the reactant might be flowed into the processing chamber simultaneously and allowed to mix/react in the gas phase prior to deposition on the substrate surface. In a less traditional method, the metal precursor and the reactive gas can be flowed separately into the processing chamber so that only one of the gases is contacting the substrate for a period of time, and both gases are mixing or contacting the substrate for a separate period of time.

In some embodiments, the substrate is sequentially exposed to the metal precursor and the reactive gas. Sequential exposure means that any given portion of the substrate is only exposed to one of the metal precursor and the reactive gas at any given time. That specific portion of the substrate is then exposed to the other of the metal precursor and the reactive gas at a different time. For example, in a spatial atomic layer deposition process, separate portions of the substrate surface are exposed to streams of the metal precursor and the reactive gas. The substrate is moved, relative to the gas distribution assembly (or vice versa), so that each individual portion of the substrate is exposed to both gas streams. In some embodiments, the metal precursor and reactive gas are simultaneously flowed into different regions of the processing chamber. These separate gas flows can be separated by an inert gas curtain to prevent gas phase reaction of the metal precursor and the reactive gas. The inert gas curtain can be any suitable gas flow, vacuum flow or combination of gas flow and vacuum flow to keep the gases separate. For example, a gas curtain can comprise a vacuum flow, a purge gas flow, and a second vacuum flow to ensure that gases on either side of the gas curtain cannot react in the gas phase.

In some embodiments, the desired metal-SiN film comprises a TaSiN film. The TaSiN film is formed by depositing TaN onto a substrate, substrate surface, or portion of a substrate surface. The TaN film is then exposed to a plasma to generate a plasma treated TaN film. A silicon nitride (SiN) layer is deposited on the plasma treated TaN film to form a TaSiN film. The TaSiN film is then annealed to decrease resistivity of the film. In some embodiments, at least a portion of a substrate surface is sequentially exposed to a tantalum-containing precursor and a reactive gas comprising ammonia to deposit a TaN film on the substrate surface.

Formation of the metal nitride film can be accomplished by any suitable technique including, but not limited to, chemical vapor deposition and atomic layer deposition. In CVD processes, the substrate can be exposed to a metal precursor and a reactant simultaneously so that the metal precursor and reactant react in the gas phase to deposit the metal nitride film. For example, a tantalum-containing precursor and ammonia can be co-flowed into the processing chamber to react and deposit a tantalum nitride film. In ALD processes, the substrate is sequentially exposed to the metal precursor and the reactant. For example, a tantalum-containing precursor and ammonia can be sequentially and separately flowed into the processing chamber so that the tantalum-containing precursor can chemisorb to the substrate surface and the ammonia reactant can react with the chemisorbed species without gas phase reactions. The ALD type reactions are theoretically self-limiting in that the chemisorption of the metal precursor will stop when there is no available substrate surface left and the reduction to the metal nitride will stop when all of the chemisorbed metal precursor has been reduced. This allows for a precise control of the thickness of the deposited film.

The reactive gas can be any suitable reactive gas capable of reacting with the metal precursor to deposit the metal nitride film. Non-limiting examples of suitable reactive gases include, but are not limited to, hydrogen (if the metal precursor contains intrinsic nitrogen), molecular nitrogen, nitrogen radicals, nitrogen ions, ammonia, $N_2H_2$ and $N_2H_4$. In specific embodiments, the metal precursor comprises a tantalum-containing precursor, or more specifically, PDMAT, and the reactive gas comprises ammonia.

The metal nitride film is exposed to a plasma. Without being bound by any particular theory of operation, it is believed that the plasma exposure, among other changes, densifies the film. The plasma can be made of any suitable species including, but not limited to hydrogen, helium, argon, nitrogen, ammonia and mixtures thereof. In some embodiments, the plasma comprises a mixture of argon and ammonia. In one or more embodiments, the plasma consists essentially of a mixture of argon and ammonia. As used in this specification and the appended claims, the term "consisting essentially of" used in this regard means that the plasma contains less than about 5% gaseous species other than the species specified. In some embodiments, the plasma comprises a mixture of argon and hydrogen. In one or more embodiments, the plasma consists essentially of a mixture of hydrogen and argon. The plasma conditions (e.g., pressure, power, exposure time and frequency) can be adjusted to ensure that the plasma suitable affects the deposited metal nitride film. For example, the frequency of the plasma can be any suitable frequency including, but not limited to, 2 MHz, 13.56 MHz, 20 MHz, 40 MHz, 60 MHz and 100 MHz. In some embodiments, the plasma frequency is about 40 MHz. The pressure of the gas (or gases) in the plasma can be in any suitable range. For example, the pressure of the plasma gas can be maintained in the range of about 1 to about 20 Torr. The spacing between the plasma and the substrate can be set to increase or decrease exposure to the energetic components of the plasma. For example, the spacing can be in the range of about 50 to about 500 mil.

The metal nitride film can be exposed to the plasma an any of several different points during the process. For example, the process may involve deposition of a single monolayer of metal nitride followed by exposure to the plasma. In some embodiments, the metal nitride film is plasma treated after deposition of no more than about 5 Å, 10 Å, 15 Å, 20 Å, 25 Å, 30 Å, 35 Å, 40 Å, 45 Å or 50 Å of metal nitride deposition. In one or more embodiments, the metal nitride film is exposed to the plasma after a specific number of monolayers of metal nitride film deposition, where the number of monolayers between plasma exposure is, or is in a range having extents of any of, about 1, about 2, about 3, about 4, about 5, about 6, about 7, about 8, about 9, about 10, about 15, about 20, about 25 or about 30 monolayers. For example, the exposure of the metal nitride film to the plasma may occur after a number of monolayers in the range of about 1 to about 30 of metal nitride film. In some embodiments, a TaN film is deposited and plasma treated after no more than about 10 Å TaN deposition. For example, a 50 Å thick TaN film might be exposed to the plasma at least five times during the deposition process (once after every 10 Å deposited). In some embodiments, forming the plasma treated metal nitride film comprises repeatedly depositing in the range of about two layers to about 5 monolayers of TaN by ALD followed by treatment with an argon/ammonia plasma until a film having a known thickness (e.g., about 50 Å) is formed.

A silicon nitride layer is deposited on the plasma treated metal nitride film. Although the term "layer" is used with respect to the SiN deposition, those skilled in the art will understand that a discrete layer may not be formed, but that the SiN may become homogeneously mixed with the metal nitride film. Without being bound by any particular theory of operation, the inventors have surprisingly found that the introduction of silicon into a TaN film interrupts the crystal stacking of the TaN resulting in a more amorphous film. The SiN layer can be deposited by any suitable technique including, but not limited to CVD and ALD. Any suitable silicon-containing precursor can be used including, but not limited to, silane, disilane, silicon halides like silicon tetrachloride, organometallic silicon precursors, trisilylamine, 1,3,5-trisilacyclohexane, 1,3,5-trisilapentane, bis(diethylamino)silane, bis(tertiarybutylamino)silane, dichlorosilane, dibromosilane, diiodosilane and mixtures thereof. In one or more embodiments, the silicon precursor may be a halogenated silane. That is, in some embodiments, the silicon precursor comprises a Si—X bond, wherein X is a halogen. In further embodiments, the silicon precursor comprises $SiH_{4-y}X_y$ or $X_{3-z}H_zSi—SiH_zX_{3-z}$, wherein X is a halide selected from the group consisting of Cl, Br and I, y has a value of 1 to 4, and z has a value of 0 to 2. In some embodiments, the first precursor comprises $SiX_4$. In other embodiments, the first precursor comprises $X_3Si—SiX_3$. In one or more embodiments, each X is independently selected from Cl, Br and I. In further embodiments, embodiments at least one of the X groups is Cl. Examples of such halogenated silanes include, but are not limited to, hexachlorodisilane (HCDS), monochorosilane, and dichlorosilane (DCS). In even further embodiments, all X groups are Cl. In embodiments where the first precursor comprises $X_3Si—SiX_3$, and all X groups are chlorine, the compound is $Cl_3Si—SiCl_3$, also known as hexachlorodisilane. Accordingly, in one or more embodiments, the silicon precursor is selected from $SiCl_4$, $SiBr_4$, or $SiI_4$.

In some embodiments, depositing the SiN layer comprises exposing the metal nitride film to a first deposition gas and a second deposition gas, either simultaneously (e.g., CVD) or sequentially (e.g., ALD). The first deposition gas can comprise any suitable silicon-containing precursor and the second deposition gas can comprise any suitable reactive gas capable of reacting with the first deposition gas. In some embodiments, the first deposition gas comprises disilane and a second deposition gas comprises ammonia and exposing the plasma treated metal nitride film to the deposition gases forms a metal-SiN film. For example, where the metal nitride film is TaN, the SiN layer deposited thereon would result in the formation of a TaSiN film.

The silicon content of the film can be controlled based on, for example, the number of SiN deposition cycles or the thickness of the SiN layer. In some embodiments, the metal-SiN film has a silicon content in the range of about 1 atomic to about 25 atomic %, or in the range of about 2 atomic % to about 20 atomic %, or in the range of about 5 atomic % to about 15 atomic %, or in the range of about 7 atomic % to about 13 atomic %.

Once the metal-SiN film has been formed, it is annealed. Without being bound by any particular theory of operation, it is believed that annealing the film reduces the resistivity and forms a temperature stable film. The metal-SiN film can be annealed under any suitable conditions. Generally, the films are annealed at temperatures greater than about 500° C., or greater than about 600° C., or greater than about 700° C., or greater than about 800° C., or greater than about 900° C., or in the range of about 500° C. to about 1000° C., or in the range of about 600° C. to about 900° C.

The atmosphere under which the film is annealed can be modified as needed. Generally, the annealing atmosphere is not reactive with the deposited film. For example, an inert atmosphere can be used with any suitable species including, but not limited to, argon, nitrogen, helium, neon and mixtures thereof. In some embodiments, annealing occurs under a nitrogen atmosphere.

The length of time that the film is annealed can also be modified as needed. For example, lower temperature annealing conditions may require longer annealing times, and vice versa. In some embodiments, the metal-SiN film is annealed for a time in the range of about 0.3 seconds to about 90 second, or in the range of about 1 second to about 10 seconds or about 5 seconds. In some embodiments, the film is flash annealed for a time in the range of about 0.1 second to about 60 seconds.

The metal-SiN film formed by the described process has been found to have surprisingly superior characteristics compared to other metal-SiN films. The thickness of the post-anneal metal-SiN film can be controlled by, for example, the number of metal nitride deposition cycles, the number of SiN deposition cycles, the thickness of one or more of the metal nitride or SiN film deposited, the annealing conditions, and combinations thereof. In some embodiments, the metal-SiN film comprises TaSiN with a post-anneal thickness of about 50 Å.

The post-anneal resistivity of the metal-SiN film shows improvement over similar films deposited by other techniques. In some embodiments, the metal-SiN film comprises TaSiN and has a post-anneal resistivity less than about 30 ohm-cm, or less than about 25 ohm-cm, or less than about 20 ohm-cm, or less than about 15 ohm-cm, or less than about 10 ohm-cm. In one or more embodiments, the pre-anneal resistivity of the TaSiN film is greater than about 5 ohm-cm, or greater than about 10 ohm-cm, or greater than about 15 ohm-cm, or greater than about 20 ohm-cm, or greater than about 25 ohm-cm, or greater than about 30 ohm-cm.

The inventors have also surprisingly found that depositing a thermally grown metal nitride film prior to ALD or CVD deposition and plasma treatment of a metal nitride film results in a more stable film. For example, when a TaSiN film is desired, a thermally grown TaN film having a thickness in the range of about 2 Å to about 20 Å can be deposited followed by ALD (or CVD) deposition of TaN with plasma treatments as described above and then ALD (or CVD) deposition of SiN as described above and annealing as described above. A film deposited in this fashion results in a resistively and thermally stable TaSiN film.

Table 1 shows several example process sequences and data associated with individual films. Each film was annealed under nitrogen for about 60 seconds at a temperature of about 750° C.

gen. In contrast, the 50 Å TaSiN film with argon/ammonia plasma treatment had a resistivity as high as 27.3 Ω·cm, slightly drifted to 22.6 Ω·cm after the 750° C. nitrogen anneal. XRD data for a sample prepared in accordance with Example D indicated that the as-introduced Si interrupted the crystal stacking of the TaN, resulting in an amorphous film.

Films deposited by the described methods can also be doped with various elements. Examples of precursors for aluminum include, but are not limited to, $AlCl_3$, $AlBr_3$, trimethylaluminium, dimethylaluminium hydride, tris(diethylamino)aluminium, trimethylamine alane, triethyl-amine alane, dimethylethylamine alane, triisobutylaluminum, triethylaluminum, dimethylaluminum hydride, and diethylaluminum chloride. Examples of gallium precursors include, but are not limited to, trimethyl gallium, gallium tribromide, gallium trichloride, triethylgallium, triisopropylgallium, tris(dimethylamido)gallium and tri-tert-butylgallium. Germanium precursors may be selected from digermane, germane, and tetramethylgermanium. Precursors for hafnium can include hafnium(IV) chloride, hafnium(IV) tert-butoxide, tetrakis(diethylamido)hafnium(IV), tetrakis(dimethylamido)hafnium(IV), and tetrakis(ethylmethylamido)hafnium(IV). Exemplary indium precursors include, indium trichloride, triethylindium, indium acetylacetonate, and indium(I) iodide. Finally, silane precursors can include, but are not limited to, silane, disilane, trimethylsilane, and neopentasilane.

Additionally, the films, methods and devices described herein can be deposited in a single wafer metal ALD chamber. Dual seal hardware can be used to minimize the oxygen content in the film to about 1%. In some embodiments, the deposition process occurs in the same chamber without breaking seal.

Other features of the process can be any suitable technique known to one of ordinary skill in the art. For example, in some embodiments, a purge gas (also referred to as a carrier gas or diluent gas) may be used during the deposition process. Any suitable purge gas may be used, such as, but not limited to, argon, helium, hydrogen, nitrogen and mixtures thereof.

In some embodiments, one or more layers may be formed during a plasma enhanced atomic layer deposition (PEALD)

TABLE 1

Example processes.

| Example | Sequence | Mean Thickness (Å) | Pre-Anneal Resistance (Ω · cm) | Post-Anneal Resistance (Ω · cm) | Resistance Difference (%) |
|---|---|---|---|---|---|
| Comp A | $(TaN:SiN)_x$ | 52.7 | 0.136 | 0.122 | −10.7 |
| B | TaN*:TaN:(3TaN:plasma$^a$:SiN)$_x$ | 62.0 | 18.41 | 1.55 | −91.5 |
| C | TaN*:TaN:(3TaN:plasma$^b$:SiN)$_x$:3TaN:plasma$^b$ | 62.5 | 8.46 | 14.59 | 72.4 |
| D | TaN*:(3TaN:plasma$^b$:SiN)$_x$:3TaN:plasma$^b$ | 52.2 | 27.3 | 22.6 | −17.0 |
| E | (3TaN:plasma$^b$:Sin)$_x$:3TaN:plasma$^b$ | 91.3 | 70.6 | 10.4 | −85.2 |

*about 10 Å thermal TaN
$^a$every three TaN monolayers treated with $NH_3$ post-plasma at 1.5 Torr, 300 W for 5 seconds
$^b$every three TaN monolayers treated with $NH_3/Ar$ post-plasma at 1.5 Torr, 300 W for 5 seconds The data from Table 1 shows that the TaSiN resistivity can be tuned to as high as about 70.6 Ω·cm when an $Ar/NH_3$ plasma treated TaN films are laminated with SiN films (Example E). Additionally, it can be seen that the addition of one ~10 Å thick thermal TaN layer is introduced as a bottom layer, the resulting TaSiN film has a resistivity that remains stable through annealing and has reached a resistance up to about 27.3 Ω·cm (Example D). The thermal stability of Example D is similar to Comparative Example A but the resistivity is about 200 times greater. A 50 Å thermal TaN film showed a 50 to 60% resistivity increase after annealing at 750° C. in nitroprocess. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas are not be required.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Time-domain ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a ternary metal nitride film, the method comprising:
   depositing a metal nitride film on a substrate;
   exposing the metal nitride film to a plasma to form a plasma treated metal nitride film;
   depositing a SiN layer on the plasma treated metal nitride film to form a metal-SiN film; and
   annealing the metal-SiN film to decrease film resistivity.

2. The method of claim 1, wherein the plasma comprises one or more of hydrogen, argon, nitrogen and ammonia.

3. The method of claim 2, wherein the plasma comprises a mixture of argon and ammonia.

4. The method of claim 1, wherein the metal of the metal nitride film comprises tantalum and the metal nitride film comprises TaN.

5. The method of claim 4, wherein the metal-SiN film comprises TaSiN and has a thickness about 50 Å.

6. The method of claim 5, wherein depositing the TaN film comprises sequentially exposing the substrate to pentakis(dimethylamino)tantalum (PDMAT) and ammonia.

7. The method of claim 6, wherein depositing the SiN layer comprises sequentially exposing the plasma treated TaN film to disilane and ammonia.

8. The method of claim 5, wherein the TaSiN film is annealed at a temperature in the range of about 600° C. to about 900° C. under a nitrogen atmosphere for a time in the range of about 30 second to about 90 seconds.

9. The method of claim 5, wherein the TaSiN film has a silicon content in the range of about 5 atomic % to about 15 atomic %.

10. The method of claim 5, wherein forming the plasma treated metal nitride film comprises repeatedly depositing in the range of about two layers to about 5 layers of TaN by ALD followed by treatment with an argon/ammonia plasma until a film having a thickness about 50 Å is formed.

11. The method of claim 5, wherein the TaN film is plasma treated after deposition of no more than 10 Å TaN.

12. The method of claim 5, wherein the post-anneal resistivity of the TaSiN film is less than about 25 ohm-cm.

13. The method of claim 5, further comprising depositing a thermal TaN film having a thickness about 10 Å prior to the deposition of the metal nitride film.

14. The method of claim 1, wherein the plasma has a frequency of about 40 MHz.

15. A method of forming a TaSiN film, the method comprising:
    sequentially exposing at least a portion of a substrate surface to a tantalum-containing precursor and a reactive gas comprising ammonia to deposit a TaN film on the substrate surface;
    exposing the TaN film to a plasma comprising ammonia and argon to form a plasma treated TaN film;
    exposing the plasma treated TaN film to deposition gases comprising disilane and ammonia to deposit a SiN layer on the plasma treated TaN film to form a TaSiN film; and
    annealing the TaSiN film to decrease film resistivity at a temperature greater than about 600° C. in an inert atmosphere.

16. The method of claim 15, wherein depositing the SiN layer comprises sequentially exposing the TaN film to a first deposition gas comprising disilane and a second deposition gas comprising ammonia.

17. The method of claim 15, wherein the tantalum-containing precursor comprises pentakis(dimethylamino)tantalum (PDMAT).

18. The method of claim 15, wherein the TaN film is exposed to the plasma after deposition of no more than about 10 Å TaN.

19. The method of claim 18, further comprising depositing a thermal TaN film as a bottom layer prior to deposition of the TaN film by sequential exposure to the tantalum-containing precursor and the reactive gas comprising ammonia.

20. A method of forming a TaSiN film, the method comprising:
    forming a plasma treated TaN film including:
    (a) exposing at least a portion of a substrate surface to a tantalum-containing precursor and a reactive gas comprising ammonia to deposit a TaN film on the substrate surface having a thickness no more than about 10 Å,
    (b) exposing the TaN film to a plasma comprising ammonia and argon to form a plasma treated TaN film, and
    (c) repeating (a) and (b) to form the plasma treated TaN film of a predetermined thickness;
    exposing the plasma treated TaN film to deposition gases comprising disilane and ammonia to deposit a SiN layer on the plasma treated TaN film to form a TaSiN film; and
    annealing the TaSiN film at a temperature greater than about 600° C. in an inert atmosphere to decrease film resistivity.

* * * * *